(12) United States Patent
Quek et al.

(10) Patent No.: US 6,969,646 B2
(45) Date of Patent: Nov. 29, 2005

(54) METHOD OF ACTIVATING POLYSILICON GATE STRUCTURE DOPANTS AFTER OFFSET SPACER DEPOSITION

(75) Inventors: Elgin Quek, Singapore (SG); Francis Benistant, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 10/361,877

(22) Filed: Feb. 10, 2003

(65) Prior Publication Data

US 2004/0164320 A1    Aug. 26, 2004

(51) Int. Cl.⁷ ............................................ H01L 21/8238
(52) U.S. Cl. .................... 438/231; 438/230; 438/303; 438/305
(58) Field of Search ...................... 438/299, 305–307, 438/515, 516, 301, 303, 229–232

(56) References Cited

U.S. PATENT DOCUMENTS

| | | | | |
|---|---|---|---|---|
| 5,021,354 A | | 6/1991 | Pfiester | 437/34 |
| 5,573,965 A | * | 11/1996 | Chen et al. | 438/297 |
| 6,063,698 A | | 5/2000 | Tseng et al. | 438/585 |
| 6,144,071 A | * | 11/2000 | Gardner et al. | 257/344 |
| 6,156,602 A | * | 12/2000 | Shao et al. | 438/238 |
| 6,157,063 A | * | 12/2000 | Iiboshi | 257/344 |
| 6,187,645 B1 | * | 2/2001 | Lin et al. | 438/305 |
| 6,235,600 B1 | * | 5/2001 | Chiang et al. | 438/305 |
| 6,248,623 B1 | | 6/2001 | Chien et al. | 438/241 |
| 6,277,683 B1 | * | 8/2001 | Pradeep et al. | 438/200 |
| 6,316,302 B1 | * | 11/2001 | Cheek et al. | 438/199 |
| 6,352,900 B1 | * | 3/2002 | Mehrotra et al. | 438/305 |
| 6,362,062 B1 | | 3/2002 | Nandakumar | 438/303 |
| 6,383,881 B1 | * | 5/2002 | Akram et al. | 438/303 |
| 6,436,747 B1 | * | 8/2002 | Segawa et al. | 438/197 |
| 6,468,915 B1 | * | 10/2002 | Liu | 438/706 |
| 6,534,388 B1 | * | 3/2003 | Lin et al. | 438/510 |
| 6,562,676 B1 | * | 5/2003 | Ju | 438/232 |
| 2002/0102802 A1 | * | 8/2002 | Tan et al. | 438/305 |
| 2002/0160553 A1 | * | 10/2002 | Yamanaka et al. | 438/149 |
| 2003/0124824 A1 | * | 7/2003 | Mehrotra et al. | 438/585 |

* cited by examiner

Primary Examiner—Amir Zarabian
Assistant Examiner—Khanh Duong
(74) Attorney, Agent, or Firm—George O. Saile; Rosemary L. S. Pike; Stephen B. Ackerman

(57) ABSTRACT

A process sequence used to integrate an anneal cycle, used to activate ion implanted dopants in a polysilicon gate structure, and the definition of offset silicon oxide spacers on the sides of the polysilicon gate structure, has been developed. The process sequence features ion implantation of dopants into a blanket polysilicon layer located overlying a metal oxide semiconductor field effect transistor (MOSFET), gate insulator layer. After definition of the polysilicon gate structure a silicon oxide layer is deposited, followed by an anneal procedure allowing activation of the implanted dopants in the polysilicon gate structure to occur. Out diffusion of implanted dopants during the activation anneal procedure is minimized as a result of the overlying silicon oxide layer. An anisotropic dry etching procedure is then performed on the silicon oxide layer resulting in the definition of offset silicon oxide spacers on the sides of the polysilicon gate structure.

16 Claims, 3 Drawing Sheets

METHOD OF ACTIVATING POLYSILICON GATE STRUCTURE DOPANTS AFTER OFFSET SPACER DEPOSITION

BACKGROUND OF THE INVENTION

(1) Field of the Invention

The present invention relates to methods used to fabricate semiconductor devices, and more specifically to a method used to reduce out diffusion of ion implanted dopants from a polysilicon gate structure during a procedure used to activate the ion implanted dopants.

(2) Description of Prior Art

Micro-miniaturization, or the ability to fabricate semiconductor devices with sub 0.25 um features, has allowed the performance of the sub 0.25 um devices to be increased while reducing the fabrication cost of a semiconductor chip comprised with sub-0.25 um features. The smaller device features result in a reduction of performance degrading parasitic capacitance, while the greater number of smaller semiconductor chips comprised with sub-0.25 um features, obtained from a specific size starting substrate, reduce the fabrication cost of an individual semiconductor chip. However specific features of a semiconductor device, such as a gate structure of a metal oxide semiconductor field effect transistor (MOSFET), device, can encounter problems when defined at widths as narrow as 0.25 um. For example the dopants in a gate structure such as a polysilicon gate structure, can be placed in the narrow width polysilicon gate structure via ion implantation procedures performed in a blanket polysilicon layer prior to gate definition. Activation of the implanted ions has to be performed to result in the desired gate structure conductivity, however the anneal procedure used for dopant activation can result in loss of implanted dopants via out diffusion from the top surface of the blanket polysilicon layer, or via out diffusion from the top surface as well as the sides of a defined polysilicon gate structure. The loss of implanted dopants will result in a less conductive gate structure thus reducing MOSFET performance.

The present invention will describe a process sequence in which the out diffusion of implanted dopants in a defined gate structure is reduced via use of a blanket insulator layer wherein the same insulator layer will be defined as a component of a composite insulator spacer on the sides of the gate structure after activation of the implanted dopants. Prior art such as Nandakumar, in U.S. Pat. No. 6,362,062 B1, Tseng et al, in U.S. Pat. No. 6,063,698, Pfiester, in U.S. Pat. No. 5,201,354, and Chien et al, in U.S. Pat. No. 6,248,623 B1, describe methods of forming offset spacers on the sides of a defined gate structure. However none of these prior art describe the process sequence featured in this present invention in which the blanket insulator layer, to subsequently be defined as a offset spacer of a composite insulator spacer, is used to reduce dopant out diffusion from all exposed surface of a gate structure during the dopant activation anneal procedure.

SUMMARY OF THE INVENTION

It is an object of this invention to fabricate a MOSFET device featuring a process sequence wherein the level of dopant out diffusion from a polysilicon gate structure is minimized.

It is another object of this invention to deposit a blanket insulator layer on the polysilicon gate structure prior to an anneal cycle used to activate the dopants in the defined polysilicon gate structure.

It is still another object of this invention to form a composite insulator spacer on the sides of the polysilicon gate structure featuring an underlying offset insulator spacer component, obtained via a spacer formation procedure applied to a blanket insulator layer, wherein the blanket insulator layer was deposited prior to the activation anneal procedure.

In accordance with the present invention a method of forming a MOSFET polysilicon gate structure on a semiconductor substrate, wherein dopant out diffusion from the polysilicon gate structure is minimized via employment of a blanket insulator layer deposited prior to an anneal procedure used to activate dopants in the polysilicon gate structure, is described. After deposition of a polysilicon layer on an underlying gate insulator layer the polysilicon layer is doped via ion implantation procedures, followed by patterning procedures employed to define a polysilicon gate structure. A blanket, first insulator layer is deposited followed by an anneal procedure used to activate the dopants in the defined polysilicon gate structure, located underlying the blanket insulator layer. A first anisotropic dry etch procedure is used to define an offset insulator spacer on the sides of the polysilicon gate structure. After formation of a lightly doped source/drain region in an area of the semiconductor substrate not covered by the polysilicon gate structure or by the offset spacer, a second insulator layer, or a composite insulator layer, is deposited. A second anisotropic dry etch procedure is next used to define a composite insulator spacer on the sides of the polysilicon gate structure, comprised of an overlying second insulator component and of an underlying offset spacer component. A heavily doped source/drain region is formed in an area of the semiconductor substrate not covered by the polysilicon gate structure or by the composite insulator spacer.

BRIEF DESCRIPTION OF THE DRAWINGS

The object and other advantages of this invention are best described in the preferred embodiments with reference to the attached drawings which include.

DESCRIPTION OF THE PREFERRED EMBODIMENTS

Figure 1:
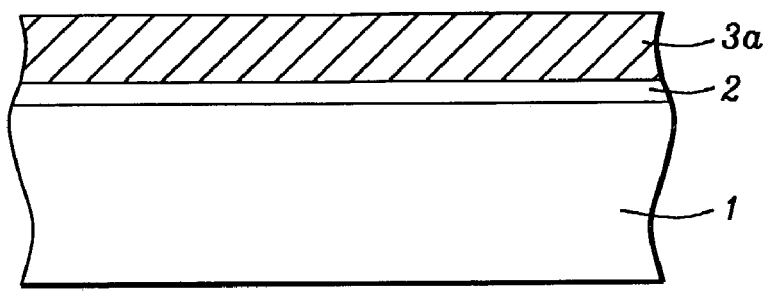
FIGS. 1–8, which schematically in cross-sectional style, describe key stages employed for the fabrication of a polysilicon gate structure wherein dopant out diffusion from the polysilicon gate structure is minimized via employment of a blanket insulator layer, deposited prior to an anneal procedure used to activate dopants in the polysilicon gate structure.

The method of fabricating a polysilicon gate structure wherein dopant out diffusion from the polysilicon gate structure is minimized via employment of a blanket insulator layer, deposited prior to an anneal procedure employed to activate dopants in the polysilicon gate structure, will now be described in detail. Semiconductor substrate 1, comprised of P type single crystalline silicon, featuring a <100> crystallographic orientation, is used and schematically shown in FIG. 1. Gate insulator layer 2, comprised of silicon dioxide, is next thermally grown to a thickness between about 12 to 35 Angstroms. Undoped polysilicon layer 3a, is next deposited via low pressure chemical vapor deposition (LPCVD), procedures, at a thickness between about 1200 to 2000 Angstroms, using silane or disilane as a source of polysilicon. This is schematically shown in FIG. 1.

Figure 2:
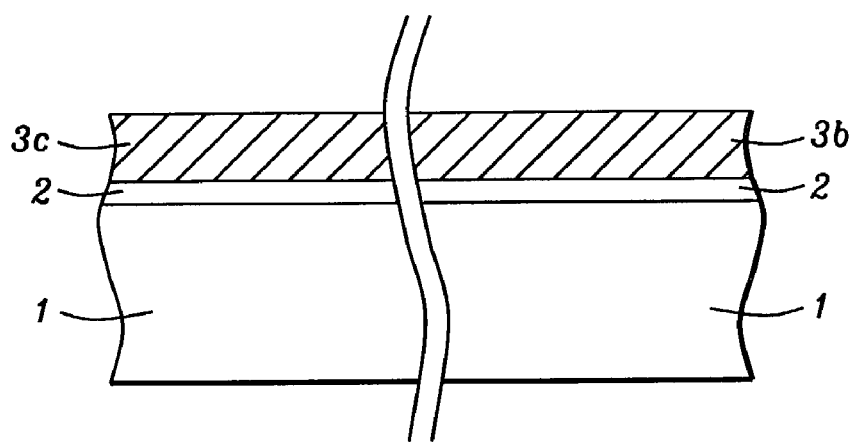

If both N channel and P channel, MOSFET devices are desired on the same semiconductor chip, or if several threshold voltages are desired for specific MOSFET devices on the same semiconductor chip, polysilicon gate structures with various doping levels can be employed. This can be accomplished via photoresist masking of specific regions of polysilicon layer 3a, during a first ion implantation procedure resulting in doped polysilicon layer 3b, followed by photoresist masking of doped polysilicon layer 3b, allowing a second ion implantation procedure to form polysilicon layer 3c, in a previously undoped region of polysilicon layer 3a, wherein the dopant level or dopant type of polysilicon layer 3c, is different then the dopant level or type of polysilicon layer 3b. This is schematically illustrated in FIG. 2. For the example used in this present invention doped polysilicon layer 3b, will be a N type doped layer, accomplished via implantation of arsenic or phosphorous ions, implanted at an energy between about 5 to 40 KeV, at a dose between about 1E15 to 8E15 atoms/cm². Doped polysilicon layer 3c, can be a P type doped layer, or if desired for work function or threshold voltage requirements, be another N type doped layer however at a different N type dopant level than doped polysilicon layer 3b. The implanted dopants in the doped polysilicon layer are not fully activated and thus in this state will not provide the desired conductive properties.

Figure 3:
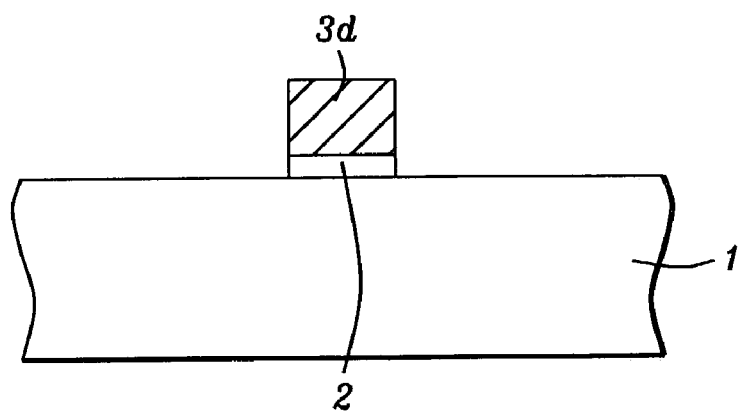

Definition of a polysilicon gate structure is next addressed and schematically described in FIG. 3. A photoresist shape, not shown in the drawings, is used as an etch mask to allow an anisotropic reactive ion etch (RIE), procedure to define polysilicon gate structure 3d, on gate insulator layer 2. In this example the polysilicon gate structure 3d, is defined from doped polysilicon layer 3b, with a width between about 0.03 to 0.35 um. The anisotropic RIE procedure is performed using $Cl_2$ as an etchant for polysilicon with the procedure selectively terminating at the appearance of the top surface of gate insulator layer 2. Removal of the photoresist shape is accomplished via plasma oxygen ashing and wet clean procedures. A buffered hydrofluoric acid cycle, used as a component of the wet clean procedure, removes the portions of gate insulator 2, not covered by polysilicon gate structure 3d.

Figure 4:
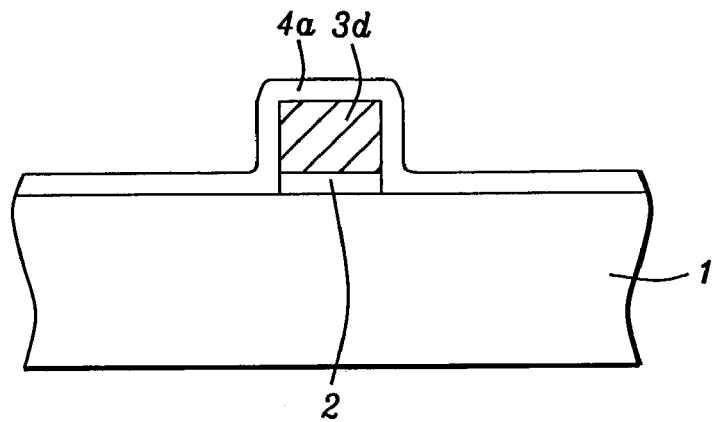

The definition of polysilicon gate structures performed, prior to an activation anneal procedure, will reduce lateral diffusion paths that would have existed in undefined, or in blanket polysilicon layer. However the exposed surfaces of polysilicon gate structure 3d, can allow out diffusion of the unactivated dopants in polysilicon gate structure 3d, if now subjected to an activation anneal procedure. Therefore to reduce the out diffusion phenomena insulator layer 4a, shown schematically in FIG. 4, is next deposited. Insulator layer 4a, can be a silicon oxide layer obtained at a thickness between about 100 to 200 Angstroms, via LPCVD or via plasma enhanced chemical vapor deposition (PECVD), procedures, using tetraethylorthosilicate (TEOS), as a source. Blanket insulator layer 4a, covering all surfaces of polysilicon gate structure 3d, is deposited at a low temperature between about 400 to 700° C., thus preventing out diffusion of the implanted dopants during deposition, as well as preventing out diffusion of the same implanted dopants during a subsequent activation anneal procedure.

Figure 5:
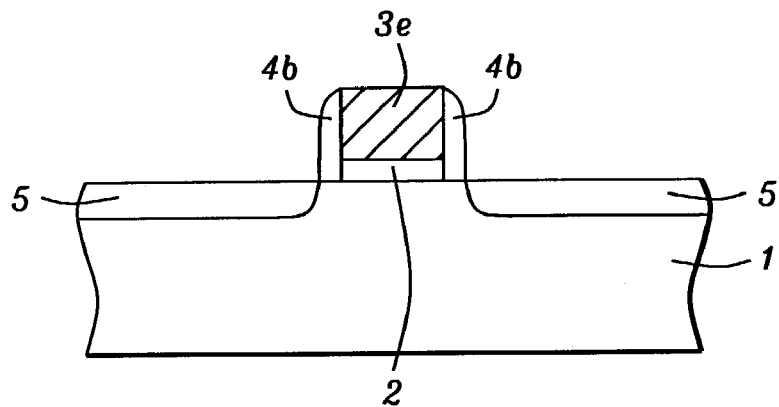

The anneal procedure used to activate the implanted dopants in the polysilicon gate structure is next addressed. A rapid thermal anneal (RTA), procedure is performed at a temperature between about 950 to 1100° C., for a time between about 5 to 30 sec., in an inert ambient such as argon or nitrogen, resulting in polysilicon gate structure 3e, now comprised with activated implanted dopants. Insulator layer 4a, covering all exposed surfaces of the polysilicon gate structure, prevented out diffusion of implanted dopants thus maximizing the conductivity of polysilicon gate structure 3e. If desired the activation anneal procedure can be accomplished via conventional furnace procedures, performed at a temperature between about 850 to 1000° C., for a time between about 5 to 20 min., in an inert ambient. A first spacer anisotropic RIE procedure is next performed to insulator layer 4a, to form insulator offset spacers 4b, on the sides of polysilicon gate structure 3e. This is accomplished using $CHF_3$ as a selective etchant for insulator layer 4a. Lightly doped source/drain (LDD), region 5, is next formed in an area of semiconductor substrate 1, not covered by polysilicon gate structure 3e, or by insulator offset spacers 4b, via implantation of arsenic or phosphorous ions at energy between about 1 to 10 KeV, for arsenic ion option, and at a dose between about 5E14 to 5E15 atoms/cm². The result of these procedures is schematically shown in FIG. 5.

Figure 6:
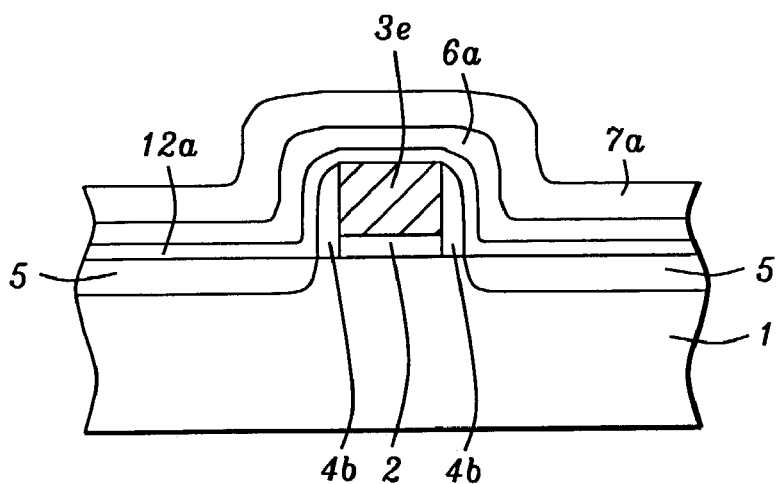
Figure 7:
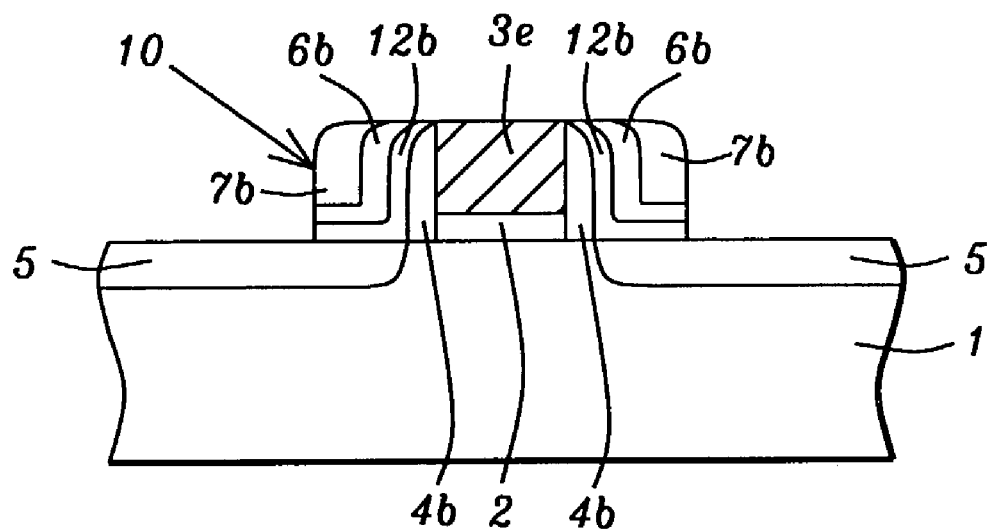

The formation of composite insulator spacers on the sides of polysilicon gate structure 4e, is next addressed and schematically described in FIGS. 6–7. Silicon oxide layer 12a, is first deposited via LPCVD or PECVD procedures, to a thickness between about 80 to 200 Angstroms, using tetraethylorthosilicate (TEOS) as a source. Next silicon nitride layer 6a, is deposited at a thickness between about 150 to 350 Angstroms, via LPCVD or PECVD procedures, followed by deposition of silicon oxide layer 7a, at a thickness between about 400 to 700 Angstroms, via LPCVD or PECVD procedures, again using TEOS as a silicon oxide source. This is schematically shown in FIG. 6. A second spacer anisotropic RIE procedure is next used to define silicon oxide spacer component 7b, with the second anisotropic RIE procedure performed using $CHF_3$ as a selective etchant for silicon oxide terminating at the appearance of the surface of silicon nitride layer 6a, wherein silicon nitride layer 6a, overlays LDD region 5. A third spacer anisotropic RIE procedure is then employed to define L shaped silicon nitride spacer component 6b. This is accomplished using $Cl_2$ as an etchant for silicon nitride layer 6a, with the anisotropic RIE procedure selectively stopping on silicon oxide layer 12a. A final cycle of the third spacer anisotropic RIE procedure features $CHF_3$ as a selective etchant for silicon oxide layer 12a, resulting in silicon oxide spacer component 12b. Composite insulator spacers 10, comprised of insulator offset spacers 4b, silicon oxide spacers 12b, L shaped silicon nitride spacers 6b, and silicon oxide spacer components 7b, is schematically shown in FIG. 7.

Figure 8:
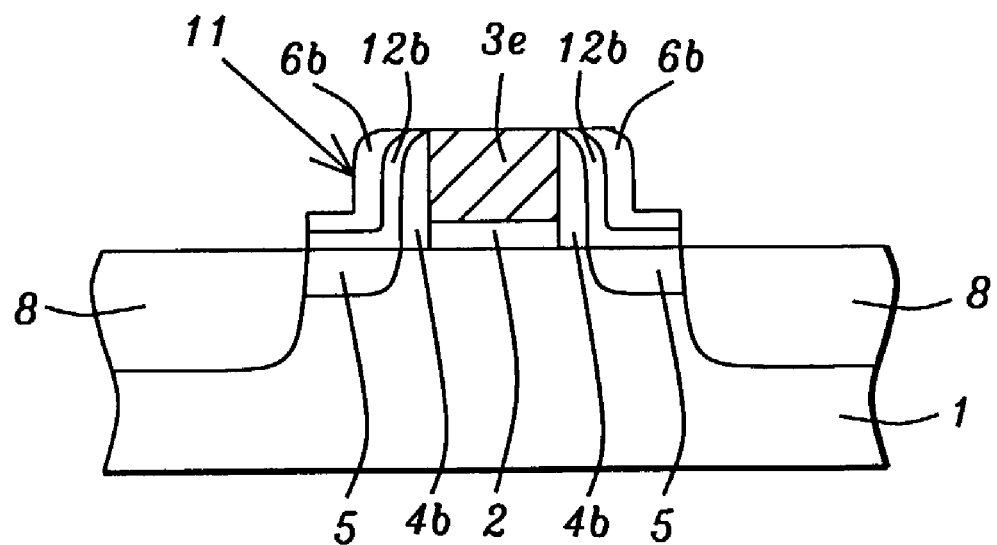

Formation of heavily doped source/drain region 8, is next formed in a region of semiconductor substrate 1, not covered by polysilicon gate structure 3e, or by composite insulator spacers 10, via implantation of arsenic or phosphorous ions, at an energy between about 35 to 90 KeV, for the arsenic option, and at a dose between about 2E15 to 7E15 atoms/cm². If desired silicon oxide spacer components 7b, can now be selectively removed via a buffered hydrofluoric wet etch procedure resulting in composite insulator spacers 11, now comprised of L shaped silicon nitride spacers 6b, silicon oxide spacers 12b, and underlying insulator offset spacers 4b. This is schematically shown in FIG. 8.

In addition, if desired composite insulator spacers can be formed comprised of the underlying insulator offset spacers and of an overlying non—L shaped silicon nitride spacer component. This would be accomplished via deposition of a silicon nitride layer at a thickness between about 500 to 700 Angstroms, followed by the anisotropic RIE procedures use to define a conventional spacer comprised of a silicon nitride component and an underlying silicon oxide offset spacer component. The heavily doped source/drain region again would be formed after definition of this composite insulator spacer. This iteration of a composite insulator spacer is not shown in the drawings.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal oxide semiconductor field effect transistor (MOSFET), on a semiconductor substrate, featuring the integration of an anneal procedure used to activate dopants in a polysilicon gate structure, and the formation of offset silicon oxide spacers on the sides of said polysilicon gate structure, comprising the steps of:

forming a gate insulator layer on said semiconductor substrate;

forming a polysilicon layer on said gate insulator layer;

performing an ion implantation procedure to place dopants in said polysilicon layer;

performing a first anisotropic RIE procedure to define said polysilicon gate structure;

forming a first silicon oxide layer directly on said polysilicon gate structure via chemical vapor deposition procedures at a temperature between about 400 to 700°C.;

immediately after forming said first silicon oxide layer performing said anneal procedure activating said dopants in said polysilicon gate structure;

performing a second anisotropic RIE procedure to define said offset silicon oxide spacers on the sides of said polysilicon gate structure;

forming a lightly doped source/drain region in an area of said semiconductor substrate not covered by said polysilicon gate structure or by said offset silicon oxide spacers;

forming a second silicon oxide layer;

forming a silicon nitride layer;

forming a third silicon oxide layer;

performing a third anisotropic RIE procedure to define first silicon oxide spacer components from said third silicon oxide layer, to define L shaped silicon nitride spacer components from said silicon nitride layer, and to define second silicon oxide spacer components from said second silicon oxide layer, resulting in a composite insulator spacers on the sides of said polysilicon gate structure, comprised of underlying, said offset silicon oxide spacers, said second silicon oxide spacer components, said L shaped silicon nitride spacer components, and overlying, said first silicon oxide spacer components; and forming a heavily doped source/drain region in an area of said semiconductor substrate not covered by said polysilicon gate structure or by said composite spacers.

2. The method of claim 1, wherein said gate insulator layer is a silicon dioxide layer, thermally grown to a thickness between about 12 to 35 Angstroms.

3. The method of claim 1, wherein said polysilicon layer is obtained via low pressure chemical vapor deposition (LPCVD), procedures, at a thickness between about 1200 to 2000 Angstroms.

4. The method of claim 1, wherein said dopants formed in said polysilicon layer are arsenic or phosphorous ions, obtained via said ion implantation procedure performed at an energy between about 5 to 40 KeV, at a dose between about 1E15 to 8E15 atoms/cm$^2$.

5. The method of claim 1, wherein said polysilicon gate structure is formed via said first anisotropic RIE procedure, performed using $Cl_2$ as an etchant for polysilicon.

6. The method of claim 1, wherein the width of said polysilicon gate structure is between about 0.03 to 0.35 um.

7. The method of claim 1, wherein said first silicon oxide layer is obtained via LPCVD or via plasma enhanced chemical vapor deposition (PECVD), procedures, at a thickness between about 100 to 200 Angstroms.

8. The method of claim 1, wherein said first silicon oxide layer is deposited using tetraethylorthosilicate (TEOS), as a source.

9. The method of claim 1, wherein said anneal procedure used to activate said dopants in said polysilicon layer is a rapid thermal anneal (RTA), procedure, performed at a temperature between about 950 to 1100° C., for a time between about 5 to 30 sec., in an inert ambient such as nitrogen or argon.

10. The method of claim 1, wherein said anneal procedure, used to activate said dopants in said polysilicon layer, is performed using conventional furnace procedures, at a temperature between about 850 to 1000° C., for a time between about 5 to 20 min., in an inert ambient such as nitrogen or argon.

11. The method of claim 1, wherein said second anisotropic RIE procedure used to define said offset silicon oxide spacers, is performed using $CHF_3$ as a selective etchant for said first silicon oxide layer.

12. The method of claim 1, wherein said lightly doped source/drain region is formed via implantation of arsenic or phosphorous ions, at an energy between about 1 to 5 KeV, for the arsenic option, and at a dose between about 5E14 to 5E15 atoms/cm$^2$.

13. The method of claim 1, wherein said silicon nitride layer is obtained via LPCVD or PECVD procedures at a thickness between about 150 to 350 Angstroms.

14. The method of claim 1, wherein said third silicon oxide layer is obtained via LPCVD or PECVD procedures at a thickness between about 400 to 700 Angstroms, using TEOS as a source.

15. The method of claim 1, wherein said third anisotropic RIE procedure used to form said first silicon oxide spacer components, said L shaped silicon nitride spacer components, and said second silicon oxide spacer components, is performed using $CHF_3$ as an etchant for silicon oxide, and using $Cl_2$ as an etchant for silicon nitride.

16. The method of claim 1, wherein said heavily doped source/drain region is formed via implantation of arsenic or phosphorous ions, at an energy between about 35 to 90 KeV, for the arsenic option, and at a dose between about 2E15 to 7E15 atoms/cm$^2$.

* * * * *